(12) United States Patent
Charles

(10) Patent No.: US 9,791,486 B2
(45) Date of Patent: Oct. 17, 2017

(54) APPARATUS FOR INCREASING RESOLUTION OF RESISTANCE SENSING

(71) Applicant: Siemens Industry, Inc., Alpharetta, GA (US)

(72) Inventor: Donald E. Charles, Wauconda, IL (US)

(73) Assignee: SIEMENS INDUSTRY, INC., Alpharetta, GA (US)

( * ) Notice: Subject to any disclaimer, the term of this patent is extended or adjusted under 35 U.S.C. 154(b) by 0 days.

(21) Appl. No.: 15/224,138

(22) Filed: Jul. 29, 2016

(65) Prior Publication Data

US 2016/0334448 A1 Nov. 17, 2016

Related U.S. Application Data

(62) Division of application No. 14/041,149, filed on Sep. 30, 2013, now Pat. No. 9,429,606.

(51) Int. Cl.
| | |
|---|---|
| *G01R 27/00* | (2006.01) |
| *G01R 27/02* | (2006.01) |
| *G01K 7/22* | (2006.01) |
| *G01K 7/24* | (2006.01) |
| *G01R 15/09* | (2006.01) |
| *G01R 27/14* | (2006.01) |
| *G01D 5/16* | (2006.01) |

(52) U.S. Cl.
CPC .............. *G01R 27/02* (2013.01); *G01D 5/16* (2013.01); *G01K 7/22* (2013.01); *G01K 7/24* (2013.01); *G01R 15/09* (2013.01); *G01R 27/14* (2013.01)

(58) Field of Classification Search
CPC ..... B08B 15/023; B08B 15/002; B08B 15/02; B08B 15/00; B08B 15/026; B08B 2215/003; F24F 11/0001; F24F 2003/1621; F24F 2011/0093; F24F 11/0012; F24F 11/0015; F24F 11/0086; F24F 2011/0026; F24F 2011/0038; F24F 2011/0042; F24F 2011/0068; F24F 11/053; F24F 13/078; F24F 3/1607; G01N 27/66; G01N 33/0004; G01N 33/0036; G01R 27/02

See application file for complete search history.

(56) References Cited

U.S. PATENT DOCUMENTS

| 4,219,803 A | 8/1980 | Horiuchi et al. |
| 4,322,725 A | 3/1982 | Annetts |

(Continued)

FOREIGN PATENT DOCUMENTS

| DE | 29516050 U1 | 2/1997 |
| EP | 0824043 B1 | 1/2003 |
| WO | 9839624 A1 | 9/1998 |

*Primary Examiner* — Vinh Nguyen

(57) ABSTRACT

An apparatus is provided that increases resolution of a resistance sensor. The apparatus may include a variable current source that produces a variable current in response to a current value. The apparatus may also include a variable resistance device that generates a variable voltage associated with the variable current. The variable resistance may have a low resistance value and a high resistance value. In addition, the apparatus may include a controller that receives a voltage value associated with the variable voltage and controls the current value in order to result in an increase in resolution of a range between the low resistance value and a high resistance value.

9 Claims, 10 Drawing Sheets

(56) References Cited

U.S. PATENT DOCUMENTS

| | | | |
|---|---|---|---|
| 4,377,346 A * | 3/1983 | Beaver | G05D 23/24 |
| | | | 236/94 |
| 4,528,898 A * | 7/1985 | Sharp | B08B 15/023 |
| | | | 454/61 |
| 4,555,695 A | 11/1985 | Machida et al. | |
| 4,856,420 A | 8/1989 | Poblete et al. | |
| 4,893,551 A * | 1/1990 | Sharp | B08B 15/023 |
| | | | 454/56 |
| 5,090,304 A | 2/1992 | Egbers et al. | |
| 5,092,227 A * | 3/1992 | Ahmed | B08B 15/023 |
| | | | 454/340 |
| 5,436,614 A | 7/1995 | Torikoshi et al. | |
| 5,608,399 A * | 3/1997 | Coleman, Jr. | H03M 1/20 |
| | | | 341/131 |
| 2004/0162697 A1 | 8/2004 | Smith et al. | |
| 2008/0198898 A1 | 8/2008 | Taylor et al. | |
| 2009/0110028 A1 | 4/2009 | Goh et al. | |
| 2010/0282239 A1 | 11/2010 | Cole | |
| 2012/0274341 A1 | 11/2012 | Fu | |
| 2012/0306460 A1 | 12/2012 | Regier et al. | |

\* cited by examiner

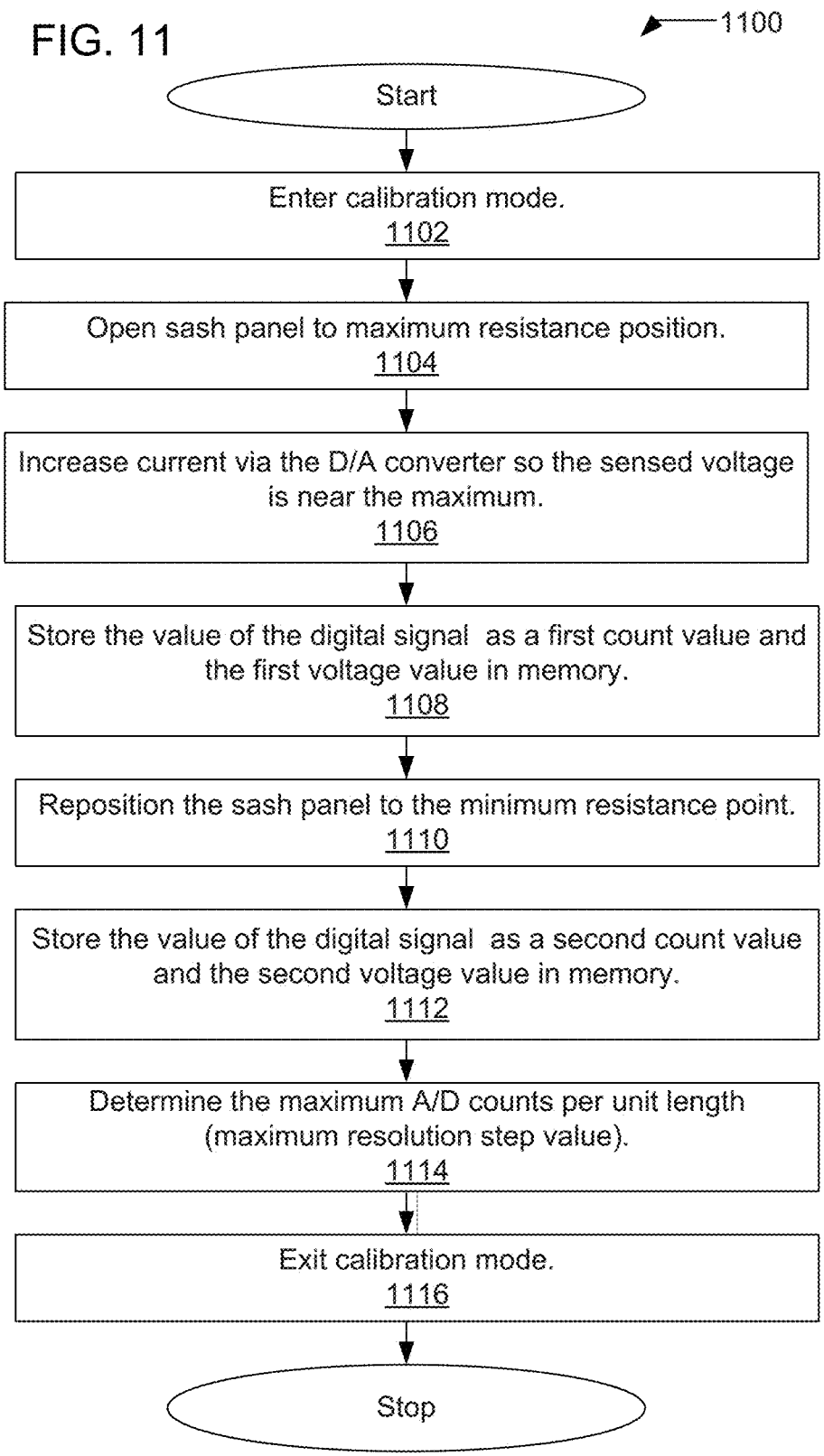

APPARATUS FOR INCREASING RESOLUTION OF RESISTANCE SENSING

CROSS-REFERENCE TO RELATED APPLICATIONS

This application is a Divisional of and claims the benefit of priority to U.S. patent application Ser. No. 14/041,149 filed on Sep. 30, 2013, now U.S. Pat. No. 9,429,606, which is incorporated by reference herein to the extent permitted by law.

FIELD OF THE INVENTION

This application relates generally to sensing a wide range of resistance based sensor values in building automation or industrial control applications.

BACKGROUND

Many building automation or industrial processes need to sense signals for a variety of process variable values within the controlled processes. Typically the sensed signal is converted by the sensing device into a voltage, current, resistance or other interface signal value and the signal value is typically proportional (linearly, nonlinearly, or other) to the sensed value.

Although there are numerous standard values used for voltage (such as 0-1V, 0-2V, 0-5V, 0-10V, 2-10V) and for current (0-1 mA, 0-2 mA, 0-10 mA, 0-20 mA, 4-20 mA), resistance values vary over a wide spectrum of values. Temperature sensors, such as a thermistor, for example may be 100 Ohm, 1,000 Ohm, 2,000 Ohm, 10,000 Ohm, and even 100,000 Ohm. Temperature sensors typically are specified at a reference resistance at a reference temperature and then supply the affect of changing temperature in equation form associated with resistance. A 100,000 ohm thermistor ranges from 33,000 to over 2,200,000 ohms depending on the sensor temperature. Additionally, many position sensors are basically a potentiometer ("pot" or variable resistance) where sensed motion changes the pot resistance. These sensors are typically 0-100 Ohm, 0-1,000 Ohm, 0-2,000 Ohm, 0-10,000 Ohm, 0-100,000 Ohm, or 0-1,000,000 Ohm but can be virtually any other beginning/ending value. Some sensors are non-linear meaning a fixed change in the sensed value at low and high ends of the sensor does not result in equal changes of resistance values. A design solution may use different input circuitry for each type of sensor range, but may expand the circuitry to allow multiple input types. Hardware, software, and or manually controlled switches may be employed to select/deselect various components or reference values.

When a circuit design uses techniques to allow a wider range of these resistance types, the result is typically a loss in the resolution of the sensed value for any/most/all of the individual ranges. That is, a single circuit for sensing 0-1000 and 0-2000 ohm values may use only half of the full scale range of the analog to digital converter verses the full range for the 0-2000 ohm sensor.

In view of the foregoing, there is an ongoing need for systems, apparatuses and methods for determining the resistance values over a wide resistance range without loss of sensed value resolution.

SUMMARY

In view of the above, a system is provided for maximizing the resolution of a resistance sensing sensor. A resistance value is changed in a variable resistor and the current passing through that resistance is converted to a voltage. The voltage is converted into a digital value via an analog-to-digital (A/D) converter that is processed by a controller. The controller also provides feedback to a digital-to-analog (D/A) converter that is able to adjust a variable current source in order to provide optimum accuracy and increased resolution, where the feedback may be accessed from a data structure stored in a memory.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

FIG. 11 illustrates a flow diagram of the approach for maximizing the resolution of the sash opening.

DESCRIPTION

I. Resistance Sensing

Figure 1:
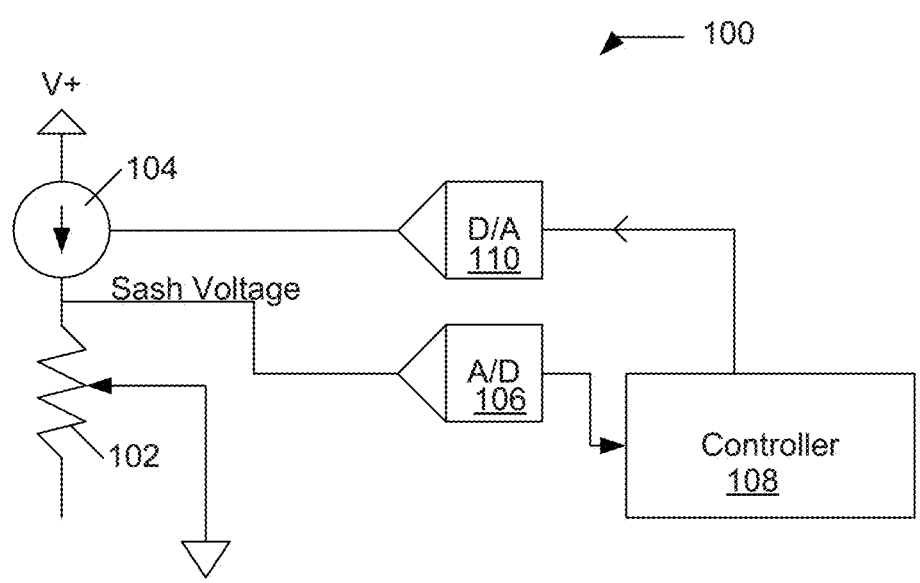
FIG. 1 illustrates a block diagram of a processor-controlled variable current approach for maximizing the range of resistance based sensor values in accordance with an example implementation.

In FIG. 1, a block diagram 100 of a processor-controlled variable current approach for maximizing the range of resistance based sensor values is illustrated. A variable resistance device, such as potentiometer 102 (commonly called a "pot") is coupled to a variable current source 104 and the input of an analog-to-digital (A/D) converter 106. A controller 108 is coupled to the output of the A/D converter 106 and the input of digital-to-analog (D/A) converter 110.

The output of D/A converter 110 is coupled to the input of the variable current source 104. The variable current source 104 does, as its name implies, provides a current value into pot or variable resistor 102. The current flowing through the pot 102 resistance causes a voltage to be developed across the pot resistance 102. In accordance with Ohm's law, the voltage will be equal to the resistance of the pot 102 times the current flowing through the pot 102.

The D/A converter 110 is shown supplying a set point value to the variable current source 104, causing the output current to change proportional to the setpoint value. The D/A converter 110 may be of any bit resolution 6, 8, 10, 12, 14, 16 or other values which yields 64, 256, 1024, 4096, 16384, or 65356 current levels respectively. When a 10 bit D/A converter 110 is used in the current example, 1024 different current values may be employed by the variable current source 104 resulting in 1024 different currents being available from the variable current source 104, and also resulting in 1024 different voltages across the pot 102. The D/A converter 110 value may be set by an algorithm executed in the controller 108.

For example, the algorithm when executed results in the 10 bit D/A converter 110 is configured to drive 1 micro Amp (uA) of current at the 0 count value and 1 additional micro Amp of current for each additional step, then current values of 1, 2, 3, 4, 5 . . . 1021, 1022, 1023 micro amps are possible and each current develops a different voltage across pot 102. The algorithm may be implemented in controller 108 as a lookup table, mathematical mapping function, other data structure that results in similar input and output values for the controller 108.

Also in FIG. 1 is an A/D converter 106 that reads the voltage developed across pot 104. The resultant voltage value is supplied to controller 108. The controller 108 contains algorithms and/or data structures to determine if the incoming voltage value is within the desired range of the A/D converter 106 and to increase the current set point from the D/A converter 110 if the sensed voltage is too low or decrease the D/A converter 110 current value if the voltage is too high. It is desirable to not exceed the maximum voltage input of the A/D converter 106.

When the voltage is within the desired range, the controller 108 may determine the current going through the pot 102 from the value commanded to the A/D controller 110 and determine the voltage across the pot 102 from the voltage reading in the desired range of the A/D converter 106. Using Ohms law, the controller 108 may determine the resistance value of the pot 102.

Figure 2:
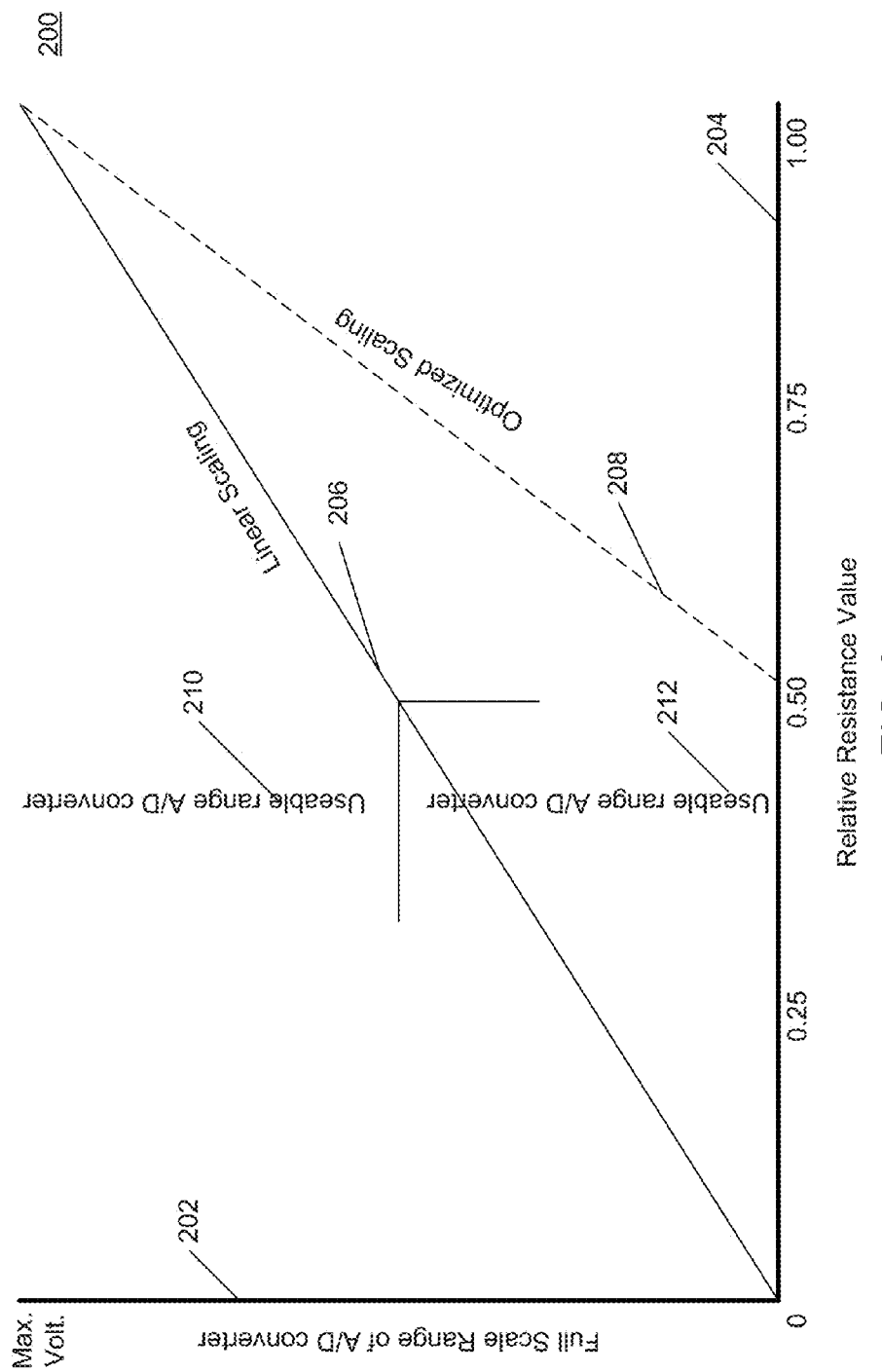
FIG. 2 illustrates a graph of the scale range of the A/D converter and relative resistance value of FIG. 1.

Turning to FIG. 2, a graph 200 of the scale range of A/D converter 202 and relative resistance value 204 of the A/D converter 106 and variable resistor 102 of FIG. 1 is illustrated. There are numerous ways to implement the above approach, but the solutions fall into categories consisting of 1) is the maximum resistance known (yes/no) and 2) is reading to be "most accurate" or "most linear". If maximum resistance is know (either by manually setting it or through activation of the pot), then the approach may calculate what current value is needed for the D/A converter 110, the value may be sent to the D/A converter 110 and the A/D converter 106 reading may be made and resistance calculated. This results in the "most linear" result 206. Optionally, as the resistance is reduced from the maximum, the D/A converter 110 may be commanded to higher current settings, resulting in more optimum A/D converter 106 readings. This option results in higher resolution of the resistance 208, but does not have a constant rate of change of measured value for same change in number of A/D converter 106 counts (voltage value). The operational range of the A/D converter 106 may limit the linear scaling to an unusable range 210 and a useable range 212.

If the maximum resistance value is not known, the D/A converter 110 may be commanded by the output of controller 108 to its minimum value and an A/D converter voltage value reading may be made. The present resistance value may be calculated from the D/A converter 110 current value and A/D converter 106 voltage values. A lookup table within the controller 108 may be used to convert A/D converter 106 voltage value (or resistance in other implementation) and determine the optimum D/A converter 110 current value setting for this resistance. That current value is commanded to the D/A converter 110 and a second reading may then be made at the optimum resolution. By keeping track of the maximum value found, the controller 108 may learn the maximum value and switch to "max value known" approach.

Figure 3:
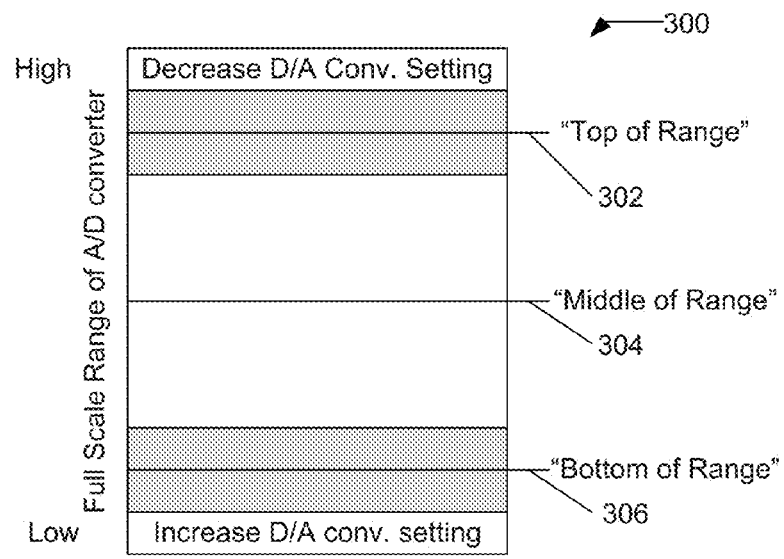
FIG. 3 illustrates the ranges of the A/D converter of FIG. 1.

In FIG. 3, an illustration 300 of the ranges of the A/D converter 106 of FIG. 1 is depicted. Many design considerations may affect where the desired voltage range is located within the overall A/D converter 106. For example, placing the desired voltage band near the top 302 of the overall A/D converter 106 range maximizes the current flow through the sensing circuit thereby minimizing electrical noise. Placing the sense range in the middle 304 of the overall range gives a wider "recovery" range should the variable resistor 102 change values (due to sensed value/position changes). While placing the sense range at the bottom 306 provides the least range for the A/D converter 106.

II. Potentiometer Sensing

Figure 4A:
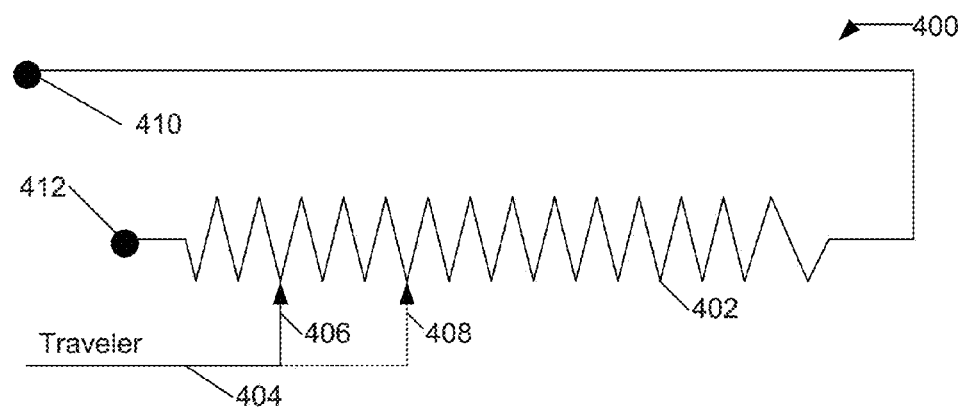
FIG. 4a illustrates a block diagram of the variable resistor of FIG. 1 having a traveler in accordance with an example implementation.

Turning to FIG. 4a, a block diagram of the variable resistor (resistive strip 402) having a traveler in accordance with an example implementation is illustrated. Here the resistive strip 402 may be moved by a traveler arm connected to ground and both "ends" of the resistive strip 402 and available for connection to two of the constant current sources. A second wiper 408 is shown as used in dual resistor sensors. In this case, the resistance from wiper 406 to end 412 of the resistive strip 402 may be measured by one current source and the resistance from wiper 408 to end 410 of the resistive strip 402 is measured by a second current source. The wipers 406 and 408 are both tied to ground so no resistance is sensed between 406 and 408. Other configurations of sensor and reference connections offer more sensing options but are considered extensions of this basic concept.

III. Resistive Temperature Sensing

Figure 4B:
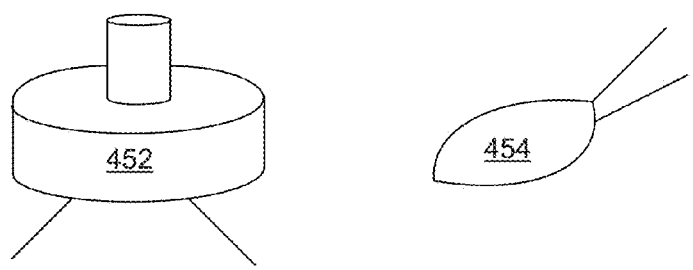
FIG. 4b illustrates examples of variable resistance devices.

In FIG. 4b examples diagrams 450 of other types of variable resistance devices is illustrated. The resistance device may be a potentiometer 452, thermistor 454, and resistive strip 402 of FIG. 4a. Other types of variable resistors may also be used as a resistive device. Many types of resistive materials are sensitive to temperature change (such as thermistor 454) and as such many are used as temperature sensors. These devices are typically specified with a typical resistance value at a specific reference temperature, and an equation or graphic to define their change in resistance verses change in temperature. Measurement of resistance of these types of sensors is done with the disclosed approach by replacing pot 102 or resistive strip 402 with a single resistive temperature sensor 454. The controller 108 may employ a lookup table for some sensor types to convert the resistance value into temperature.

Figure 5:
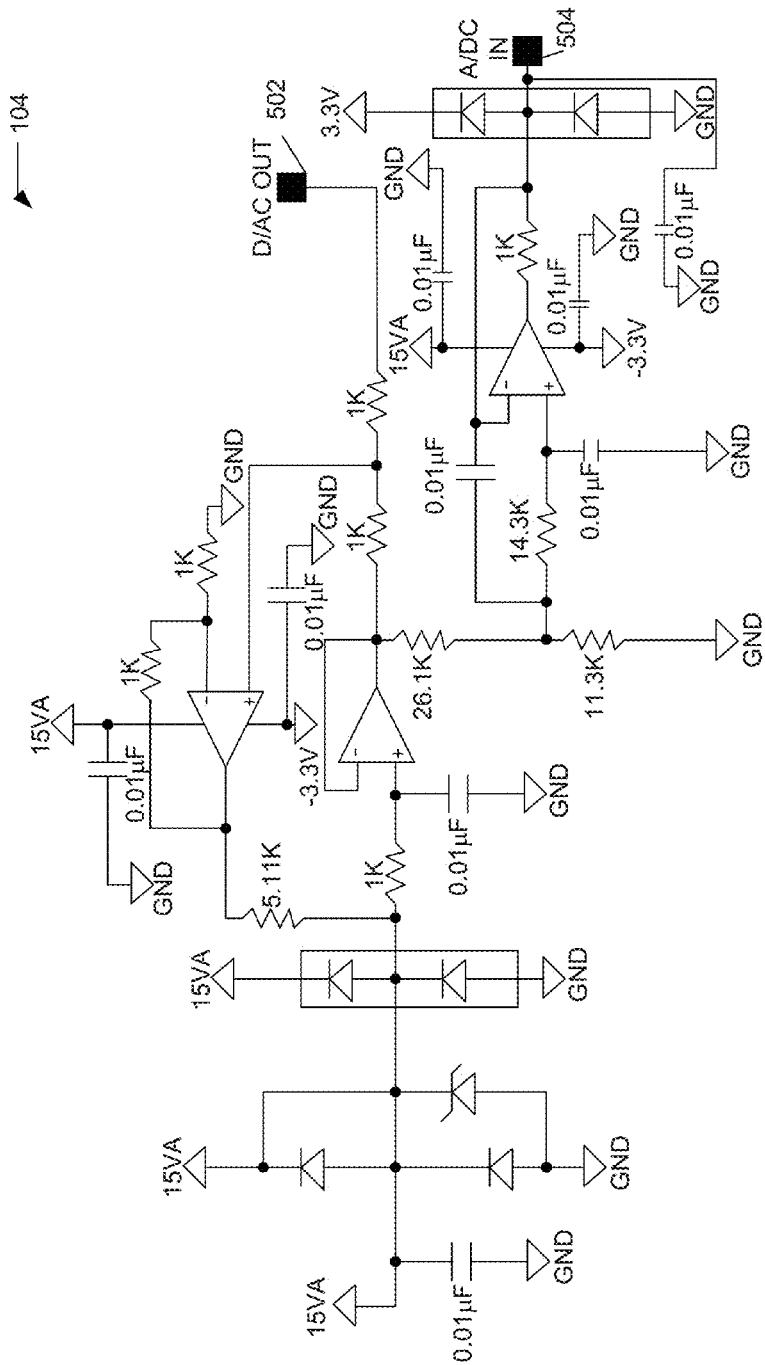
FIG. 5 illustrates a circuit diagram of an example variable current source of FIG. 1.

Turning to FIG. 5, a circuit diagram of an example implementation for the variable current source 104 of FIG.

1. The current source 104 has a digital voltage output 502 and an analog voltage input 504. In other implementations, other types of current sources may be employed. The variable current source 104 generates a variable current, where the variable current is a current that may change in relationship to the analog voltage input 504.

Figure 6:
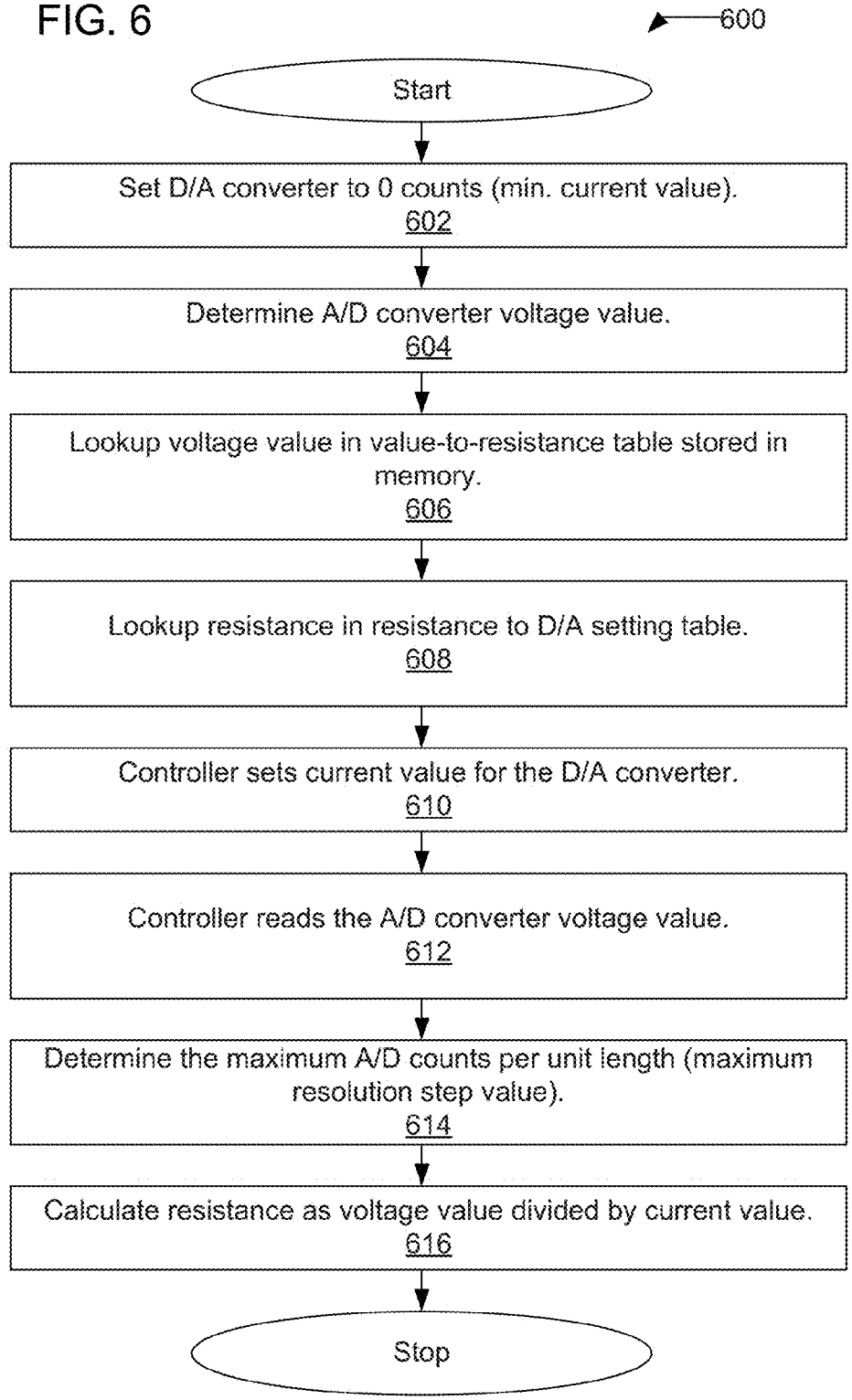
FIG. 6 illustrates a flow diagram of the approach for maximizing the resolution of resistance sensing in accordance with an example implementation of the invention.

In FIG. 6, a flow diagram 600 of the approach for maximizing the resolution of resistance sensing is illustrated. The D/A converter 110 may be set to 0 counts (current value) in step 602. The voltage at the A/D converter 106 is converted to a voltage value in step 604. The voltage value is then used by the controller 108 to access a value-to-resistance table stored in the controller's memory in step 606 to determine resistance. In step 608, the resistance is used to look up the D/A setting (current value) in the resistance to D/A converter 110 setting table. The controller 108 may then set the current value for the D/A converter 110 in step 610. The controller 108, in step 612, reads the voltage value from the A/D converter 106. The controller 108 may then determine the maximum A/D converter counts per unit length (maximum resolution step value) in step 614. In step 616, the controller 108 is able to calculate the resistance as voltage value (derived from A/D 106) divided by current value (derived from D/A 110). If the "maximum" resistance is known by the controller, the controller may go directly to step 608

IV. Fume Hoods and Fume Hood Sashes

As used herein, the term "sash" refers to a movable panel or door positioned to cover a fume hood opening where movement of the sash varies the area of the fume hood opening. As used herein, the term "sash opening" refers to the fume hood opening defined by the position of the sash panel where the maximum area of the fume hood opening is defined by the area of the fume hood opening with the sash panels positioned at a maximum open position.

Figure 7:
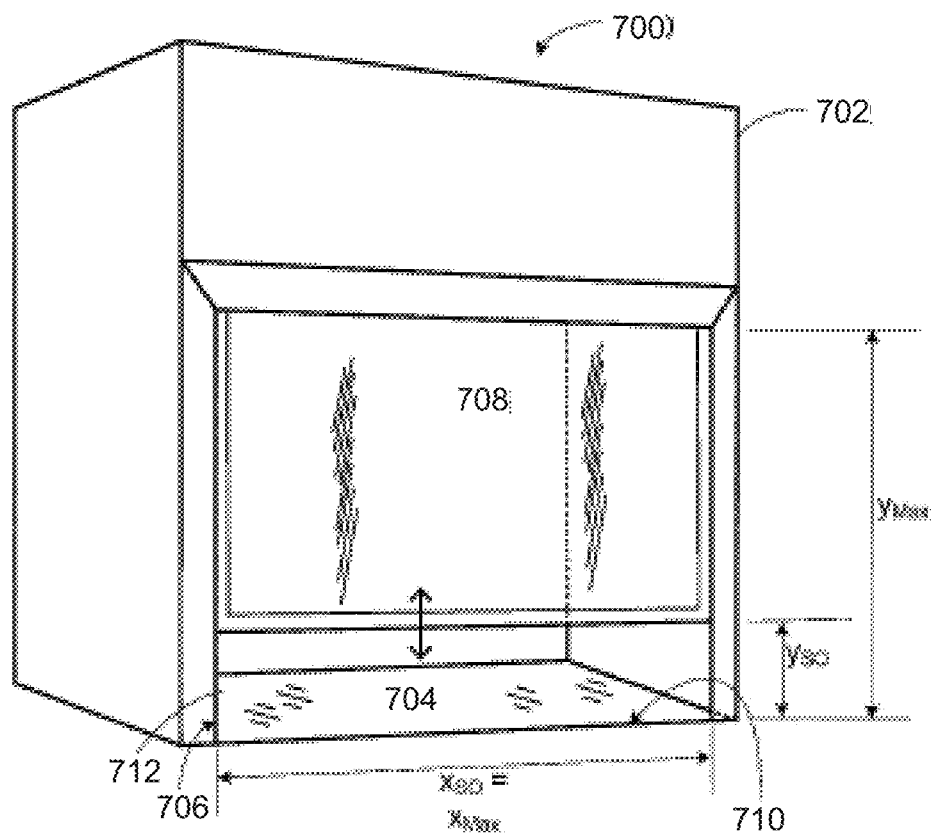
FIGS. 7 and 8 are perspective illustrations of examples of fume hoods in which example implementations for determining a sash-opening area may be implemented by sensing resistance as in FIG. 1 in accordance with an example implementation.
Figure 8:
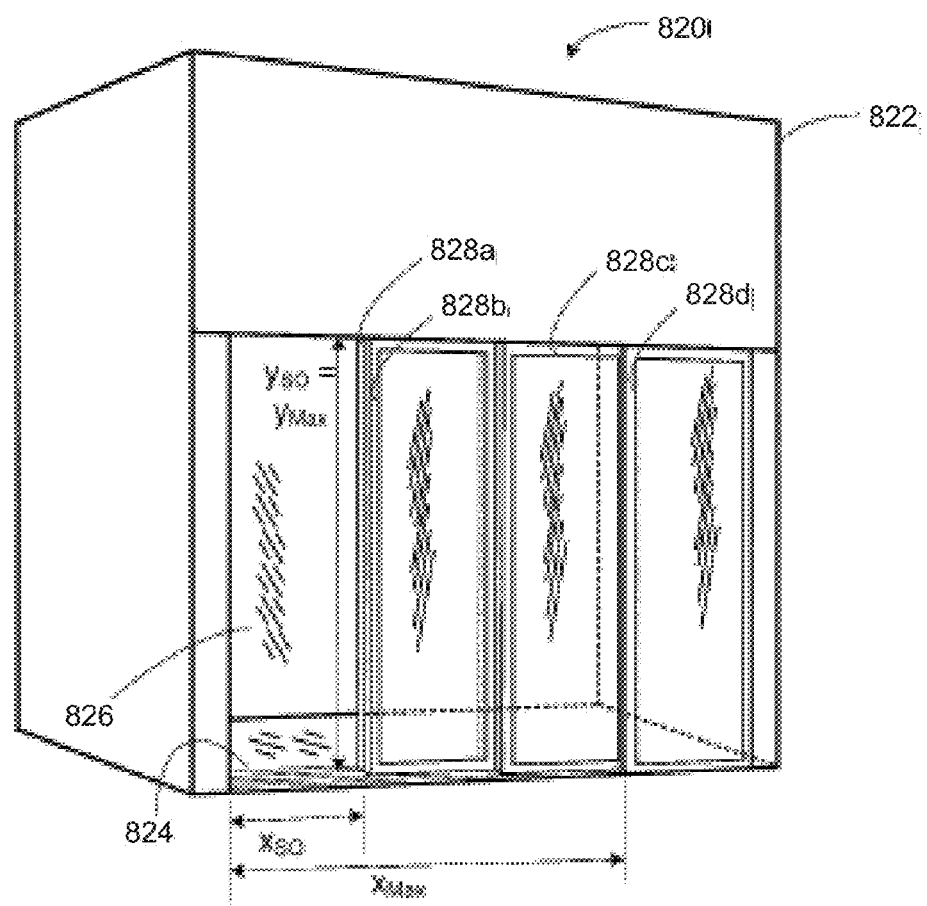

FIGS. 7 and 8 are perspective illustrations of examples of fume hoods in which example implementations of systems and methods for determining a sash-opening area may be implemented. FIG. 7 shows a first fume hood 700 comprising an enclosure structure 702, a work surface 704, and a vertically movable sash panel 708. The enclosure structure 702 encloses the area of the work surface 704 on which work involving toxic or noxious fumes, vapors, and/or dust may be performed. A hood opening 706 provides access to the work surface 704. The hood opening 706 may be defined by a cutout in a front side or other side of the enclosure structure 702 having a vertical or longitudinal dimension of "$y_{Max}$" and a horizontal or latitudinal dimension of "$x_{Max}$" as shown in FIG. 7. The vertically movable sash panel 708 is used to open or close the hood opening 706. In the example implementation shown in FIG. 7 the sash panel 708 moves in a vertical direction such that the sash panel 708 is spaced above an edge 710 of the work surface 704 to form a sash opening 712 (as portion of hood opening 706) having a sash height $H=y_{sash}$, which has a value within the range of 0 to $y_{Max}$ for providing access to the work surface 704.

The fume hood 700 is connected to an exhaust fan and damper arrangement by ductwork (not shown in the Figures). The exhaust fan serves to draw air from the room through the sash opening 712, the interior of the enclosure structure 702, the ductwork and the damper. The air is then vented outside of the building by the exhaust fan thereby removing fumes, vapors or dust. A fume hood controller (not shown in FIGS. 7 and 8) may be included in or near the fume hood 700 to maintain the speed of the air (referred to herein as the face velocity) drawn through the fume hood 700 within a desired air speed range. If the face velocity is too low, there may be insufficient venting of the work surface 704. If the face velocity is too high, undesirable air turbulence is generated, which may cause movement of the contaminants into a worker's breathing zone. An acceptable range for the face velocity may vary between approximately 80-120 feet per minute (fpm) depending on the type of hood and hazard.

The fume hood controller may be configured to control the exhaust fan or fans, and dampers to keep the face velocity in the proper range. Typically, the ventilation system for the fume hood may be integrated with the ventilation system of the building in which the fume hood is installed. In such implementations, the fume hood controller may control air valves or dampers to adjust the face velocity. The face velocity is affected by the area or size of the sash opening 712 and any pressure drop that may exist across the sash panel 708. In order to maintain the face velocity within the desired range given that the sash panel 708 is movable, an air valve may be adjusted to take into account the current size of the sash opening 712. For example, an air valve may be controlled to increase air flow as the size of the sash opening 712 is increased. Conversely, the air valve is controlled to decrease the air flow as the size of the sash opening 712 is decreased. Similarly, the air valve may be adjusted to take into account the size of the sash opening 712 for the configuration shown in FIG. 7.

The fume hood 820 shown in FIG. 8 includes an enclosure structure 822 similar to that of the fume hood 700 in FIG. 7, and sash panels 828a, 828b, 828c, 828d that move horizontally to provide a sash opening 826 to access a work surface 824. The first sash panel 828a is shown moved over to a position in which it is directly behind the second sash panel 828b. The sash opening 826 shown in FIG. 1B has a width $x_{sash}$ from 0 to $x_{Max}$. The sash opening 826 has a fixed height of $y_{Max}$.

The sash opening 126 may be located at different positions along the width of a hood opening, which is the total opening in the fume hood 820 when the sash panels 828a, 828b, 828c, 828b are removed. As noted above, the sash opening 826 is formed by positioning the first sash panel 828a to a position behind the second sash panel 828b. The sash opening 826 may also be formed by moving the first and second sash panels 828a&b over to the left-most side leaving the sash opening 826 to extend to the right to the third sash panel 828c. The sash opening 826 may also be formed by moving the second sash panel 828b to the left and the third sash panel 828c to the right. The maximum width $x_{Max}$ in the fume hood 820 in FIG. 8 is the width of the hood opening (without sash panels) minus the width of one of the sash panels. In another implementation, the sash panels 828 et seq. may be moved to a position beyond the outermost edges of the hood opening (without sash panels).

The sash opening area may be determined for the sash openings in the fume hoods shown in FIGS. 7 and 8 by determining an area of a rectangle formed by the edges around the sash opening shown in each drawing. The rectangle of the sash opening in each fume hood 700, 820 has an area $A(x,y)=x_{sash} \cdot y_{sash}$. Example implementations of systems and methods for determining the area of a sash opening using an emitter and sensor panel are described below. It is noted that the examples described below are for a fume hood similar to the fume hood 820 in FIG. 8 in which horizontally movable sashes 828 et seq. are used to provide the sash opening 826. Those of ordinary skill in the art will understand that the examples described herein may be similarly implemented in fume hoods having openings regardless of how they are formed.

Figure 9:
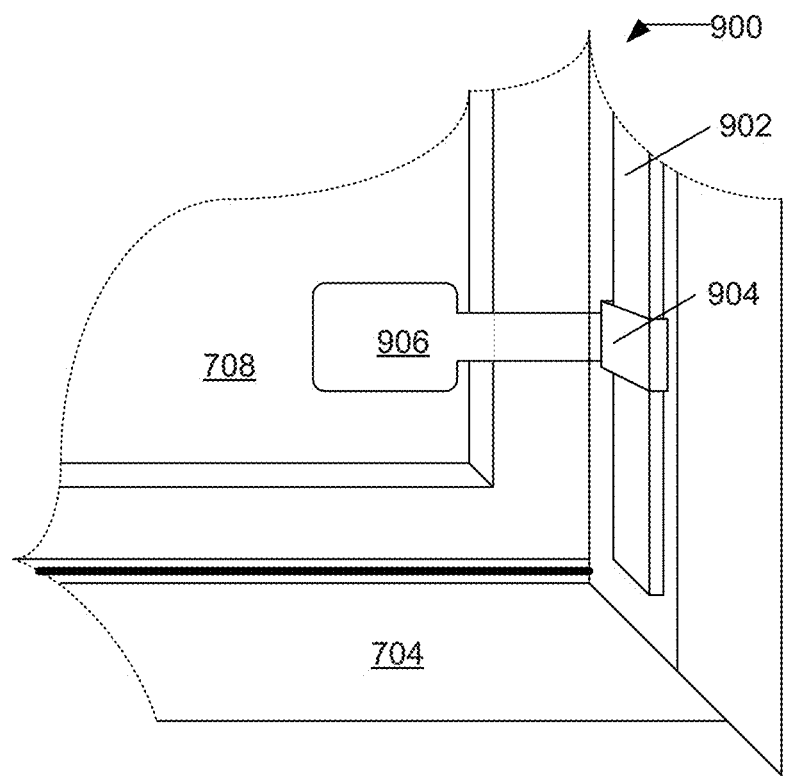
FIG. 9 illustrates a perspective cut-away drawing of the fume hood with a resistance strip and traveler attached to the sash panel of FIG. 7 in accordance with an example implementation.

In FIG. 9, is a perspective cut-away drawing 900 of the fume hood 700 illustrating the resistive strip 902 and traveler 904 attached to the sash panel 708 by an arm 906 in accordance with an example implementation. The sash panel 708 in the closed position seals near the work surface 704 in the current example. When the sash panel is an open position the arm 906 causes the traveler 904 to move upon the resistive strip 902. In the current example the traveler 904 moves up with the sash 708 when it is being opened and down when the sash 708 is being closed. Thus the sash has a closed position, and an open position. The open position may be any opening created by the sash 708 with completely open being the maximum amount of opening that the sash 708 may create. As the traveler 904 moves it moves from a low resistance value to a resistance value that is identified as a maximum resistance value (maximum resistance is not a maximum of the resistive strip 902, rather it is a maximum that is generated by the traveler 904 when the sash 708 is fully open). In other implementations, the resistive stripe by be inverted with closed is the maximum resistive value and opening reduces the resistance generated by the resistive strip 902. The resistance from the resistive strip may have a current passed through it resulting in a voltage. As was explained above, the current may be generated by a variable current source that is adjusted to optimize the available resolution of the resistance value and A/D converter sensing range.

Figure 10:
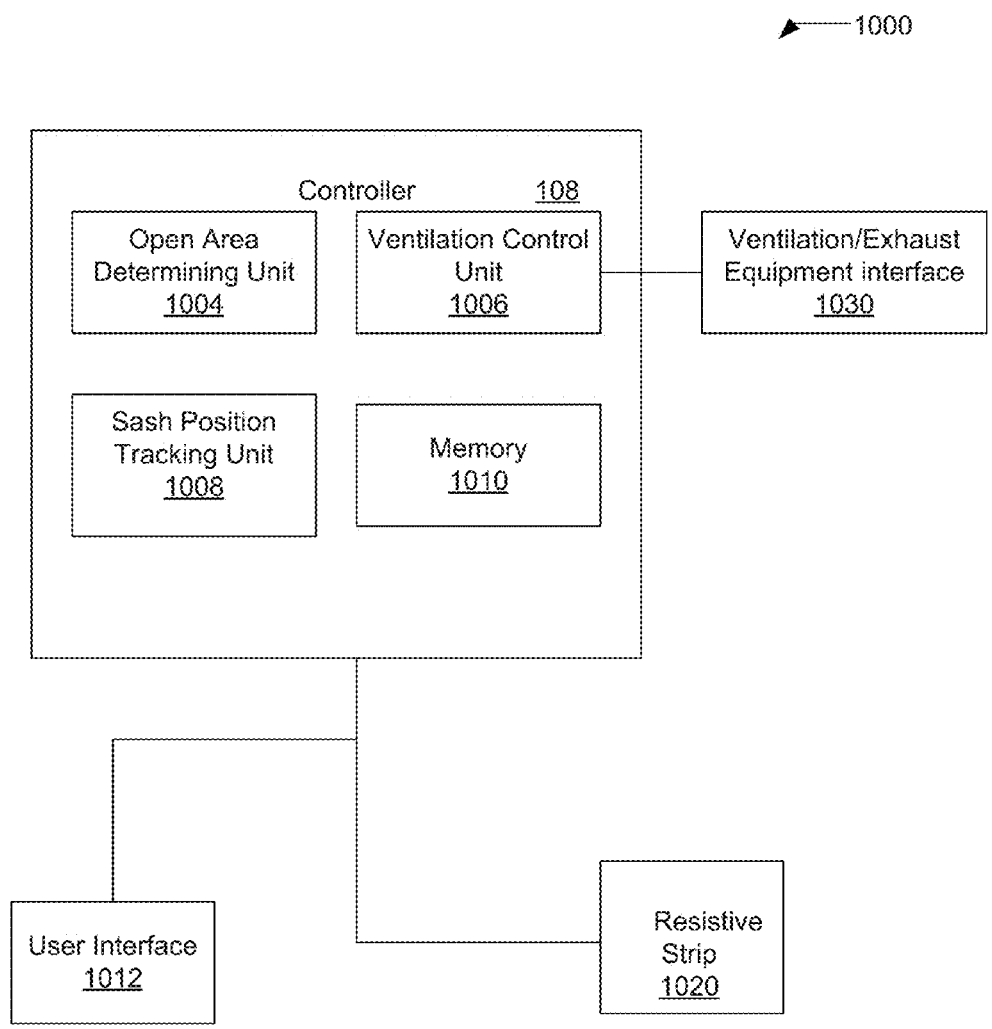
FIG. 10 illustrates a block diagram of the control of the fume hood of FIG. 7.

In FIG. 10, a block diagram 1000 of the control of the fume hood 700 of FIG. 7 is illustrated. The controller 108 may have one or more modules, such as open area determining unit 1004, ventilation control unit 1006, sash position tracking unit 1008, and memory 1010. The controller 108 may be coupled to the user interface 1012 and the resistive strip 1020. The ventilation control unit 1006 may be coupled to a ventilation/exhaust equipment interface 1030.

The controller 108 may perform the function of tracking the sash position using the sash position tracking unit 1008 by receiving a digital signal from A/D converter 106. The resolution of the digital signal is adjusted by the sash position tracking unit providing a digital signal that is converted by D/A 110 converter into an analog signal that is used to adjust the variable current source 104.

The ventilation control unit 1006 uses the area of the sash opening to control the ventilation in the fume hood so that the face velocity is maintained within a desired range. The ventilation control unit 1006 may communicate with ventilation/exhaust equipment through a ventilation/exhaust equipment interface 1030 to adjust fans and dampers as determined by the ventilation control unit 1006. The ventilation/exhaust equipment interface 1030 may also include connections to strategically placed pressure sensors to measure a pressure gradient between the inside of the fume hood and the outside of the fume hood. The actual algorithms for determining the proper settings of the fans and/or dampers for a desired range of face velocity are well known to those of ordinary skill in the art and, therefore, need not be discussed in any further detail.

The user interface 1012 coupled to the controller 108 may be used to initially set the values for the current source 104. The initial setup values may include the initial current and maximum current. The initial setup values may be stored in memory 1010. The initial setup values may be set during a calibration period or by having the controller 108 enter a calibration mode.

During normal operation, each sash position value is sensed thru the respective resistance sensor. The resistance is converted to a sash (window) position on the sash track, and that position converts to a 2 dimensional space blocked by the individual sash (window). Knowing the position of each sash (window) the controller calculates the open surface area of the front of fume hood. As shown in prior art, the open face area multiplied by the air flow rate results in the CFM of air going into the fume hood. As one or more sashes are moved by the user, the controller gathers the new sash positions, recalculates the CFM and commands the exhaust damper to open or close an amount to offset the change in CFM caused by the sash movements. This assures a near constant air inflow into the fume hood and assures the safety of the person/people using the fume hood.

In FIG. 11, a flow diagram 1100 of the approach for maximizing the resolution of the sash opening of a sash panel 708 is illustrated. The approach is employed during the configuration of the sash panel 708 by entering a calibration mode via the user interface in step 1102. The calibration may start with the sash panel 108 in a maximum resistance position 1104 (fully open in the current example.) In other implementations, the maximum resistance may be entered manually. In step 1106, the D/A converter 110 increases current so the sensed voltage is near the maximum rated voltage for A/D 106. The value of the digital signal is then stored in memory 1010 as a first stored count value and first voltage value in step 1108. In step 1110, the sash panel 708 may then be repositioned to the minimum resistance point (sash panel 708 closed position.) The value of the D/A 110 is stored as the second stored value and second voltage value in step 1112. The first and second stored values define the maximum A/D counts for a given opening size (best resolution possible). The maximum sensed voltage and maximum A/D counts per unit length is then determined 1114. If more than one sash door is used on the fume hood 700, then the process is repeated for that hood. Calibration mode is then exited via the user interface 1116.

It will be understood and appreciated that one or more of the modules and steps described in connection with FIGS. 6 and 11 may be performed by hardware, software, or a combination of hardware and software on one or more electronic or digitally-controlled devices. The software may reside in a memory in a suitable electronic processing component. The memory may include an ordered listing of executable instructions for implementing logical functions (that is, "logic" that may be implemented in digital form such as digital circuitry or source code, or in analog form such as an analog source such as an analog electrical, sound, or video signal). The instructions may be executed within a processing module, which includes, for example, one or more microprocessors, general purpose processors, combinations of processors, digital signal processors (DSPs), field programmable gate arrays (FPGAs), application-specific integrated circuits (ASICs), or microcontroller. Further, the diagrams describe a logical division of functions having physical (hardware and/or software) implementations that are not limited by architecture or the physical layout of the functions. The example systems described in this application may be implemented in a variety of configurations and operate as hardware/software components in a single hardware/software unit, or in separate hardware/software units.

The executable instructions may be implemented as a computer program product having instructions stored there in which, when executed by a processing module of an electronic system, direct the electronic system to carry out the instructions. The computer program product may be selectively embodied in any non-transitory computer-readable storage medium for use by or in connection with an instruction execution system, apparatus, or device, such as a electronic computer-based system, processor-containing system, or other system that may selectively fetch the instructions from the instruction execution system, apparatus, or device and execute the instructions. In the context of this document, computer-readable storage medium is any non-transitory means that may store the program for use by or in connection with the instruction execution system, apparatus, or device. The non-transitory computer-readable storage medium may selectively be, for example, an electronic, magnetic, optical, electromagnetic, infrared, or semiconductor system, apparatus, or device. A non-exhaustive list of more specific examples of non-transitory computer readable media include: an electrical connection having one or more wires (electronic); a portable computer diskette (magnetic); a random access, i.e., volatile, memory (electronic); a read-only memory (electronic); an erasable programmable read-only memory such as, for example, Flash memory (electronic); a compact disc memory such as, for example, CD-ROM, CD-R, CD-RW (optical); and digital versatile disc memory, i.e., DVD (optical). Note that the non-transitory computer-readable storage medium may even be paper or another suitable medium upon which the program is printed, as the program may be electronically captured via, for instance, optical scanning of the paper or other medium, then compiled, interpreted, or otherwise processed in a suitable manner if necessary, and then stored in a computer memory or machine memory.

What is claimed is:

1. An apparatus that increases resolution of resistance sensing, comprising:
    a controller;
    a variable current source that produces a variable current in response to a current value set by the controller;
    a variable resistance device that produces a variable resistance and that generates a variable voltage based on both the variable current and on the variable resistance; and
    an analog to digital (A/D) converter that produces a voltage value based on the variable voltage,
    wherein the controller is configured to:
        receive the voltage value;
        control the current value via a digital to analog (D/A) converter based on the received voltage value such that the controller causes the current value to be increased and/or decreased to cause the variable voltage to be in a voltage range as the variable resistance changes that is less than a maximum range of voltages capable of being converted by the A/D converter to the voltage value; and
        determine the variable resistance based on the received voltage value and the controlled current value.

2. The apparatus of claim 1, where the variable resistance device includes a resistive strip.

3. The apparatus of claim 2, where the resistive strip further includes a traveler coupled to a sash of a fume hood, wherein movement of the sash causes the traveler to move across the resistive strip and change the variable resistance.

4. The apparatus of claim 1, where the variable resistance device is a potentiometer.

5. The apparatus of claim 1, where the variable resistance device is a thermistor.

6. The apparatus of claim 5, where the thermistor is associated with a thermostat.

7. The apparatus of claim 1, wherein the controller is configured to determine a maximum resistance of the variable resistance device and further control the current value based on the determined maximum resistance.

8. The apparatus of claim 7, wherein the controller is configured to determine the maximum resistance via monitoring the determined variable resistance over time.

9. The apparatus of claim 1, where the controller is a microcontroller.

* * * * *